(12) United States Patent
Garcia et al.

(10) Patent No.: US 11,008,835 B2
(45) Date of Patent: May 18, 2021

(54) HORIZONTAL RESERVOIR DESCRIPTION SYSTEMS (71) Applicant: HALLIBURTON ENERGY SERVICES, INC., Houston, TX (US)

(72) Inventors: Mariano Nicolas Garcia, Denver, CO (US); Muthukumarappan Ramurthy, Denver, CO (US); Donald Pat Kundert, Denver, CO (US)

(73) Assignee: Halliburton Energy Services, Inc., Houston, TX (US)

(*) Notice: Subject to any disclaimer, the term of this patent is extended or adjusted under 35 U.S.C. 154(b) by 530 days.

(21) Appl. No.: 15/750,502

(22) PCT Filed: Sep. 3, 2015

(86) PCT No.: PCT/US2015/048441
§ 371 (c)(1),
(2) Date: Feb. 5, 2018

(87) PCT Pub. No.: WO2017/039676
PCT Pub. Date: Mar. 9, 2017

(65) Prior Publication Data
US 2018/0230781 A1     Aug. 16, 2018

(51) Int. Cl.
*E21B 49/00* (2006.01)
*E21B 41/00* (2006.01)
(Continued)

(52) U.S. Cl.
CPC .......... *E21B 41/0092* (2013.01); *E21B 43/26* (2013.01); *E21B 43/263* (2013.01);
(Continued)

(58) Field of Classification Search
USPC ................ 703/2, 10; 702/6, 9, 12, 7; 175/45
See application file for complete search history.

(56) References Cited

U.S. PATENT DOCUMENTS 9,157,318 B2* 10/2015 Koepsell ................. E21B 49/00
10,339,709 B1* 7/2019 Mallet ..................... G06T 17/05
(Continued)

FOREIGN PATENT DOCUMENTS

| WO | 0039612 | 7/2000 |
| WO | 201439612 | 3/2014 |

OTHER PUBLICATIONS

Buller, Dan, et al. "A new mineralogy cuttings analysis workflow for optimized horizontal fracture-stage placement in organic shale reservoirs." SPE Annual Technical Conference and Exhibition. Society of Petroleum Engineers, 2014.
(Continued)

*Primary Examiner* — Thai Q Phan
(74) *Attorney, Agent, or Firm* — Locke Lord LLP (57) ABSTRACT

A method for modeling a reservoir includes receiving vertical formation data describing geological formations in a vertical direction as a function of vertical depth, receiving near-wellbore horizontal formation data describing the geological formations in a horizontal or deviated direction near a wellbore up to a wellbore instrument range, and correlating the vertical formation data with the near-wellbore horizontal formation data to create horizontally adjusted formation data to describe the geological formations in the vertical direction beyond the wellbore instrument range, along the horizontal or deviated direction.

25 Claims, 7 Drawing Sheets (51) Int. Cl.
    *G01V 99/00*     (2009.01)
    *G01V 11/00*     (2006.01)
    *G06F 30/00*     (2020.01)
    *E21B 43/26*     (2006.01)
    *E21B 43/263*     (2006.01)
    *G01V 1/30*     (2006.01)
    *E21B 47/06*     (2012.01)

(52) U.S. Cl.
    CPC .............. *E21B 49/00* (2013.01); *G01V 11/00* (2013.01); *G01V 99/005* (2013.01); *G06F 30/00* (2020.01); *E21B 47/06* (2013.01); *G01V 1/306* (2013.01)

(56) References Cited

U.S. PATENT DOCUMENTS

| | | | | | |
|---|---|---|---|---|---|
| 2004/0064257 | A1* | 4/2004 | Tobias | ................... | G01V 1/306 702/6 |
| 2004/0225442 | A1* | 11/2004 | Tobias | ................... | G01V 1/306 702/9 |
| 2009/0236147 | A1* | 9/2009 | Koltermann | ......... | C10M 173/02 175/65 |
| 2010/0312478 | A1* | 12/2010 | Tabanou | ................ | G01V 11/00 702/7 |
| 2011/0295510 | A1* | 12/2011 | Gulati | .................... | G01V 1/288 702/16 |
| 2012/0191354 | A1 | 7/2012 | Caycedo | | |
| 2015/0000980 | A1* | 1/2015 | Williams | .............. | E21B 49/003 175/45 |
| 2015/0012251 | A1* | 1/2015 | Horne | .................... | G01V 1/306 703/2 |
| 2015/0134255 | A1* | 5/2015 | Zhang | .................. | G01V 99/005 702/7 |
| 2016/0178772 | A1* | 6/2016 | Carter | .................... | G01V 1/282 702/17 |
| 2016/0341834 | A1* | 11/2016 | Bartetzko | ................ | G01V 1/50 |
| 2019/0310391 | A1* | 10/2019 | Ramurthy | ............ | G01V 99/005 |

OTHER PUBLICATIONS

Nho, PCT International Search Report for PCT Application No. PCT/US2015/048441 dated May 31, 2016.

Nho, PCT Written Opinion for PCT Application No. PCT/US2015/048441 dated May 31, 2016.

* cited by examiner

HORIZONTAL RESERVOIR DESCRIPTION SYSTEMS

FIELD OF THE DISCLOSURE

The disclosed embodiments generally relates to drilling, and more particularly, to methods and systems for horizontal wellbore and reservoir description.

BACKGROUND

Traditional systems for describing reservoirs in the horizontal direction include taking wellbore instrument logs in a horizontal and/or otherwise deviated, non-vertical wellbore. However, existing tools only have an effective radius of less than a foot which does not provide many details of a reservoir in the horizontal and/or vertical direction.

While such existing systems have generally been satisfactory in the art, there is a need for improved horizontal and/or vertical reservoir description systems beyond the instruments range

BRIEF DESCRIPTION OF THE DRAWINGS

The accompanying appendices and/or drawings illustrate various no g, exemplary, aspects in accordance with the present disclosure.

DETAILED DESCRIPTION OF CERTAIN EMBODIMENTS

The illustrated embodiments are now described more fully with reference to the accompanying drawings wherein like reference numerals identify similar structural/functional features. The illustrated embodiments are not limited in any way to what is illustrated as the illustrated embodiments described below are merely exemplary, which can be embodied in various forms, as appreciated by one skilled in the art. Therefore, it is to be understood that any structural and functional details disclosed herein are not to be interpreted as limiting, but merely as a basis for the claims and as a representation for teaching one skilled in the art to variously employ the discussed embodiments. Furthermore, the terms and phrases used herein are not intended to be limiting but rather to provide an understandable description of the illustrated embodiments.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the illustrated embodiments, exemplary methods and materials are now described.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

It is to be appreciated the illustrated embodiments discussed below can be a software algorithm, program or code residing on computer useable medium having control logic for enabling execution on a machine having a computer processor. The machine typically includes memory storage configured to provide output from execution of the computer algorithm or program.

As used herein, the term "software" is meant to be synonymous with any code or program that can be in a processor of a host computer, regardless of whether the implementation is in hardware, firmware or as a software computer product available on a disc, a memory storage device, or for download from a remote machine. The embodiments described herein include such software to implement the equations, relationships and algorithms described above. One skilled in the art will appreciate further features and advantages of the illustrated embodiments based on the above-described embodiments. Accordingly, the illustrated embodiments are not to be limited by what has been particularly shown and described, except as indicated by the appended claims.

Figure 1:
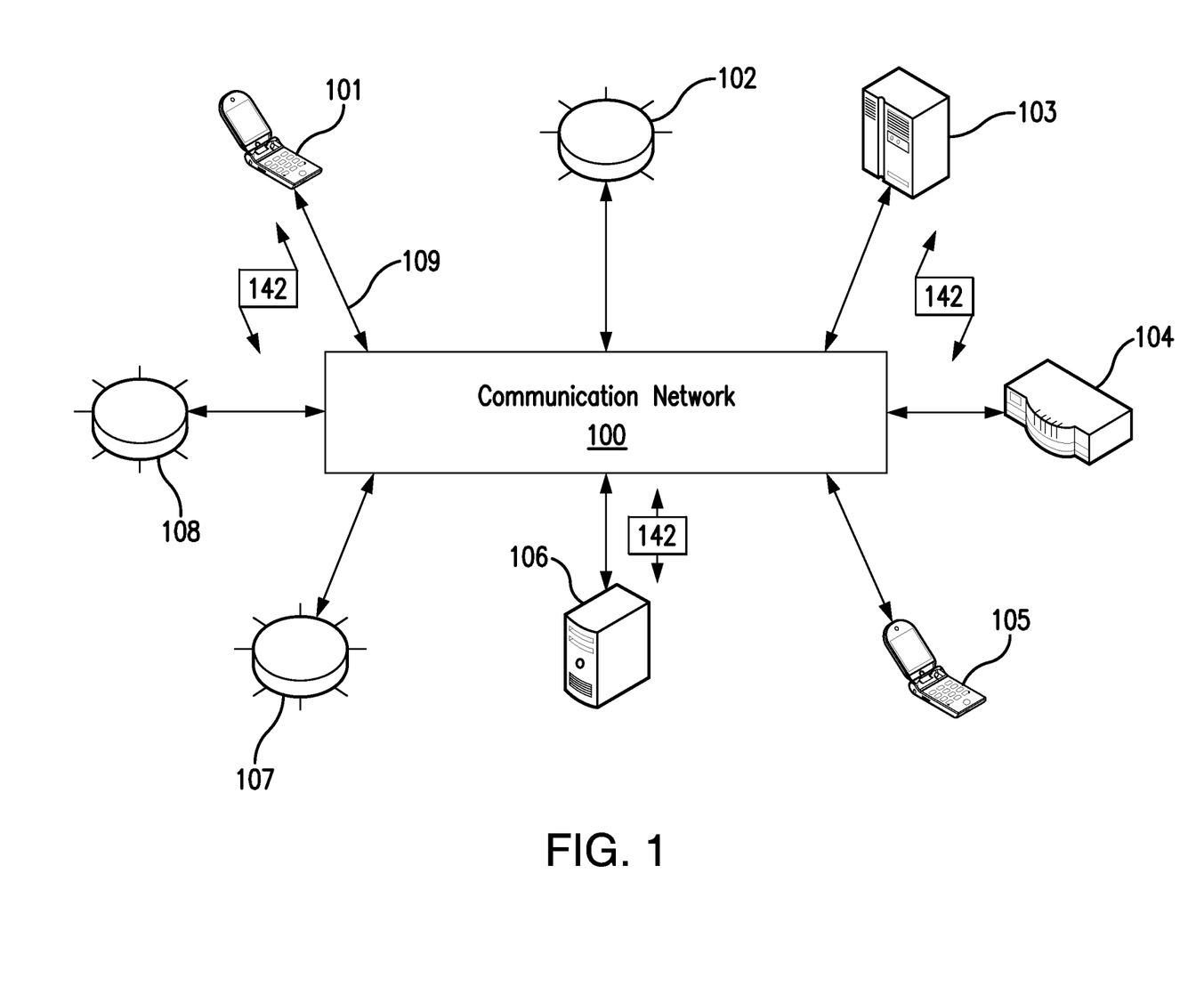
FIG. 1 illustrates an example communication network in accordance with this disclosure.

Turning now descriptively to the drawings, in which similar reference characters denote similar elements throughout the several views, FIG. 1 depicts an exemplary communications network 100 in which below illustrated embodiments may be implemented.

It is to be understood a communication network 100 can be a geographically distributed collection of nodes interconnected by communication links and segments for transporting data between end nodes, such as personal computers, work stations, smart phone devices, tablets, televisions, sensors and or other devices such as automobiles, etc. Many types of networks are available, with the types ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC), and others.

FIG. 1 is a schematic block diagram of an example communication network 100 illustratively comprising nodes/devices 101-108 (e.g., sensors 102, client computing devices 103, smart phone devices 105, web servers 106, routers 107, switches 108, and the like) interconnected by various methods of communication. For instance, the links 109 may be wired links or may comprise a wireless communication medium, where certain nodes are in communication with other nodes, e.g., based on distance, signal strength, current operational status, location, etc. Moreover, each of the devices can communicate data packets (or frames) 142 with other devices using predefined network communication protocols as will be appreciated by those skilled in the art, such as various wired protocols and wireless protocols etc., where appropriate. In this context, a protocol consists of a set of rules defining how the nodes interact with each other. Those skilled in the art will understand that any number of nodes, devices, links, etc. may be used in the computer network, and that the view shown herein is for simplicity. Also, while the embodiments are shown herein with reference to a general network cloud, the description herein is not so limited, and may be applied to networks that are hardwired.

As will be appreciated by one skilled in the art, aspects of this disclosure may be embodied as a system, method or computer program product. Accordingly, aspects of this disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure are described below with reference to flowchart illustrations and/or block diagrams of methods, apparatus (systems) and computer program products according to embodiments of disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
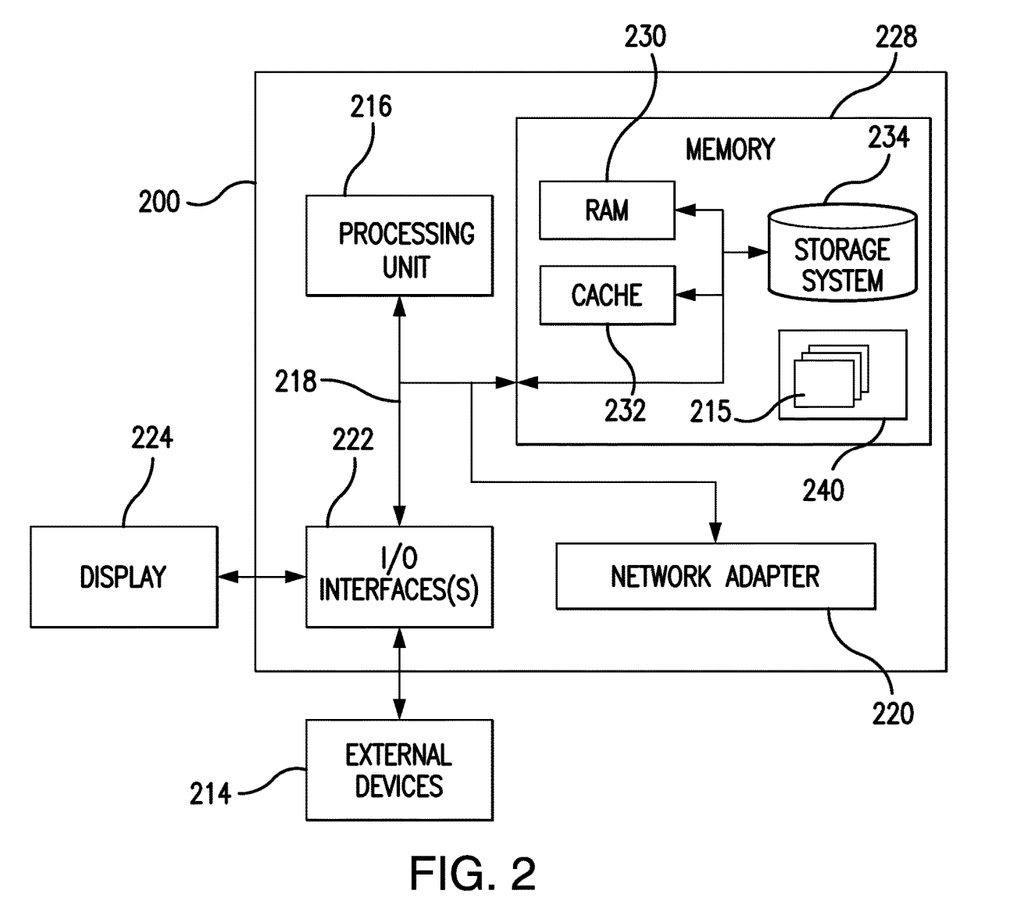
FIG. 2 illustrates an example network device/node in accordance with this disclosure.

FIG. 2 is a schematic block diagram of an example network computing device 200 (e.g., client computing device 103, server 106, etc.) that may be used (or components thereof) with one or more embodiments described herein, e.g., as one of the nodes shown in the network 100. As explained above, in different embodiments these various devices are configured to communicate with each other in any suitable way, such as, for example, via communication network 100.

Device 200 is intended to represent any type of computer system capable of carrying out the teachings of various embodiments of this disclosure. Device 200 is only one example of a suitable system and is not intended to suggest any limitation as to the scope of use or functionality of embodiments of disclosure described herein. Regardless, computing device 200 is capable of being implemented and/or performing any of the functionality set forth herein.

Computing device 200 is operational with numerous other general purpose or special purpose computing system environments or configurations. Examples of well-known computing systems, environments, and/or configurations that may be suitable for use with computing device 200 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, and distributed data processing environments that include any of the above systems or devices, and the like.

Computing device 200 may be described in the general context of computer system-executable instructions, such as program modules, being executed by a computer system. Generally, program modules may include routines, programs, objects, components, logic, data structures, and so on that perform particular tasks or implement particular abstract data types. Computing device 200 may be practiced in distributed data processing environments where tasks are performed by remote processing devices that are linked through a communications network. In a distributed data processing environment, program modules may be located in both local and remote computer system storage media including memory storage devices.

Device 200 is shown in FIG. 2 in the form of a general-purpose computing device. The components of device 200 may include, but are not limited to, one or more processors or processing units 216, a system memory 228, and a bus 218 that couples various system components including system memory 228 to processor 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing device 200 typically includes a variety of computer system readable media. Such media may be any available media that is accessible by device 200, and it includes both volatile and non-volatile media, removable and non-removable media.

System memory 228 can include computer system readable media in the form of volatile memory, such as random access memory (RAM) 230 and/or cache memory 232. Computing device 200 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of disclosure.

Program/utility 240, having a set (at least one) of program modules 215, such as underwriting module, may be stored in memory 228 by way of example, and not limitation, as well as an operating system, one or more application programs, other program modules, and program data. Each of the operating system, one or more application programs, other program modules, and program data or some combination thereof, may include an implementation of a networking environment. Program modules 215 generally carry out the functions and/or methodologies of embodiments of disclosure as described herein.

Device 200 may also communicate with one or more external devices 214 such as a keyboard, a pointing device, a display 224, etc.; one or more devices that enable a user to interact with computing device 200; and/or any devices (e.g., network card, modem, etc.) that enable computing device 200 to communicate with one or more other computing devices. Such communication can occur via Input/Output (I/O) interfaces 222. Still yet, device 200 can communicate with one or more networks such as a local area network (LAN), a general wide area network (WAN), and/or a public network (e.g., the Internet) via network adapter 220. As depicted, network adapter 220 communicates with the other components of computing device 200 via bus 218. It should be understood that although not shown, other hardware and/or software components could be used in conjunction with device 200. Examples, include, but are not limited to: microcode, device drivers, redundant processing units, external disk drive arrays, RAID systems, tape drives, and data archival storage systems, etc.

FIGS. 1 and 2 are intended to provide a brief, general description of an illustrative and/or suitable exemplary environment in which embodiments of this disclosure may be implemented. FIGS. 1 and 2 are exemplary of a suitable environment and are not intended to suggest any limitation as to the structure, scope of use, or functionality of an embodiment of this disclosure. A particular environment should not be interpreted as having any dependency or requirement relating to any one or combination of components illustrated in an exemplary operating environment. For example, in certain instances, one or more elements of an environment may be deemed not necessary and omitted. In other instances, one or more other elements may be deemed necessary and added.

Figure 3:
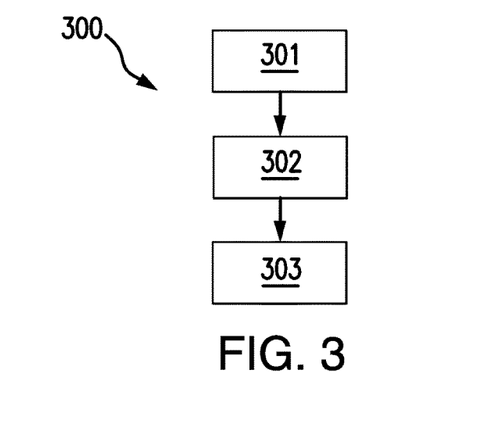
FIG. 3 illustrates a flow chart of an embodiment of a method in accordance with this disclosure.

With the exemplary communication network 100 (FIG. 1) and computing device 200 (FIG. 2) being generally shown and discussed above, description of certain illustrated embodiments of this disclosure will now be provided. With reference now to FIG. 3, shown is a flow chart demonstrating implementation of the various exemplary embodiments. It is noted that the order of steps shown in FIG. 3 is not necessarily required, so in principle, the various steps may be performed out of the illustrated order in any suitable manner. Also certain steps may be skipped, different steps may be added or substituted, or selected steps or groups of steps may be performed in a separate application following the embodiments described herein.

Figure 8:
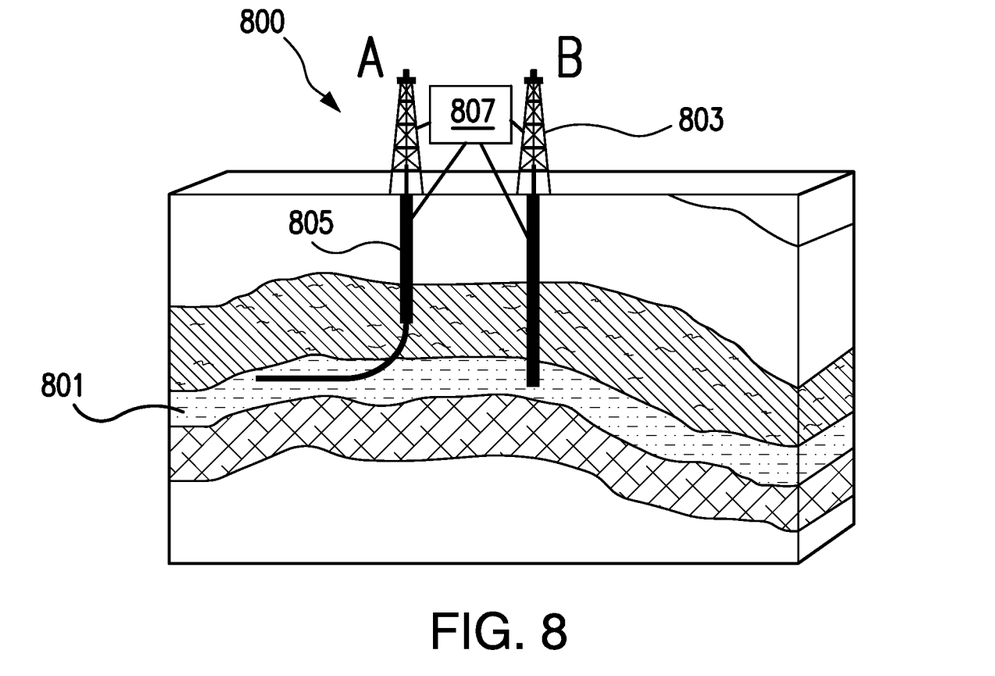
FIG. 8 illustrates an embodiment of a system in accordance with this disclosure.

Referring to FIG. 3, in accordance with at least one aspect of this disclosure, a method 300 for modeling a reservoir (e.g., reservoir 801 as shown in FIG. 8) can include receiving (e.g., block 301) vertical formation data describing geological formations in a vertical direction as a function of vertical depth. The method 300 also includes receiving (e.g., block 303) near-wellbore horizontal formation data describing the geological formations in a horizontal or deviated direction (e.g., non-vertical direction) near a wellbore up to a wellbore instrument range. The method also includes correlating (e.g., block 305) the vertical formation data with the near-wellbore horizontal formation data to create horizontally adjusted formation data to describe the geological formations in the vertical direction beyond the wellbore instrument range, along the horizontal or deviated direction.

Receiving vertical formation data (e.g., block 301) may include receiving vertical formation data from one or more vertical or deviated offset wells (e.g., offset vertical well 803 as shown in FIG. 8). The vertical formation data and/or near-wellbore horizontal data can include any suitable formation data. For example, the data can include at least one of seismic data, mud log data, gamma ray data, x-ray diffraction (XRD) data, x-ray fluorescence (XRF), cuttings and/or core data, pressure and rate-transient data, or any other suitable open hole logging, cased hole logging, logging while drilling (LWD), or measurement while drilling (MWD) data.

In certain embodiments, the method can further include uniformly extrapolating the vertical formation data along the horizontal direction before correlating the horizontal formation data with the vertical formation data. In this regard, referring to FIG. 4 for example, the method can further include initially defining one or more horizontal formation members 201 as a function of the vertical and/or horizontal formation data.

Figure 4:
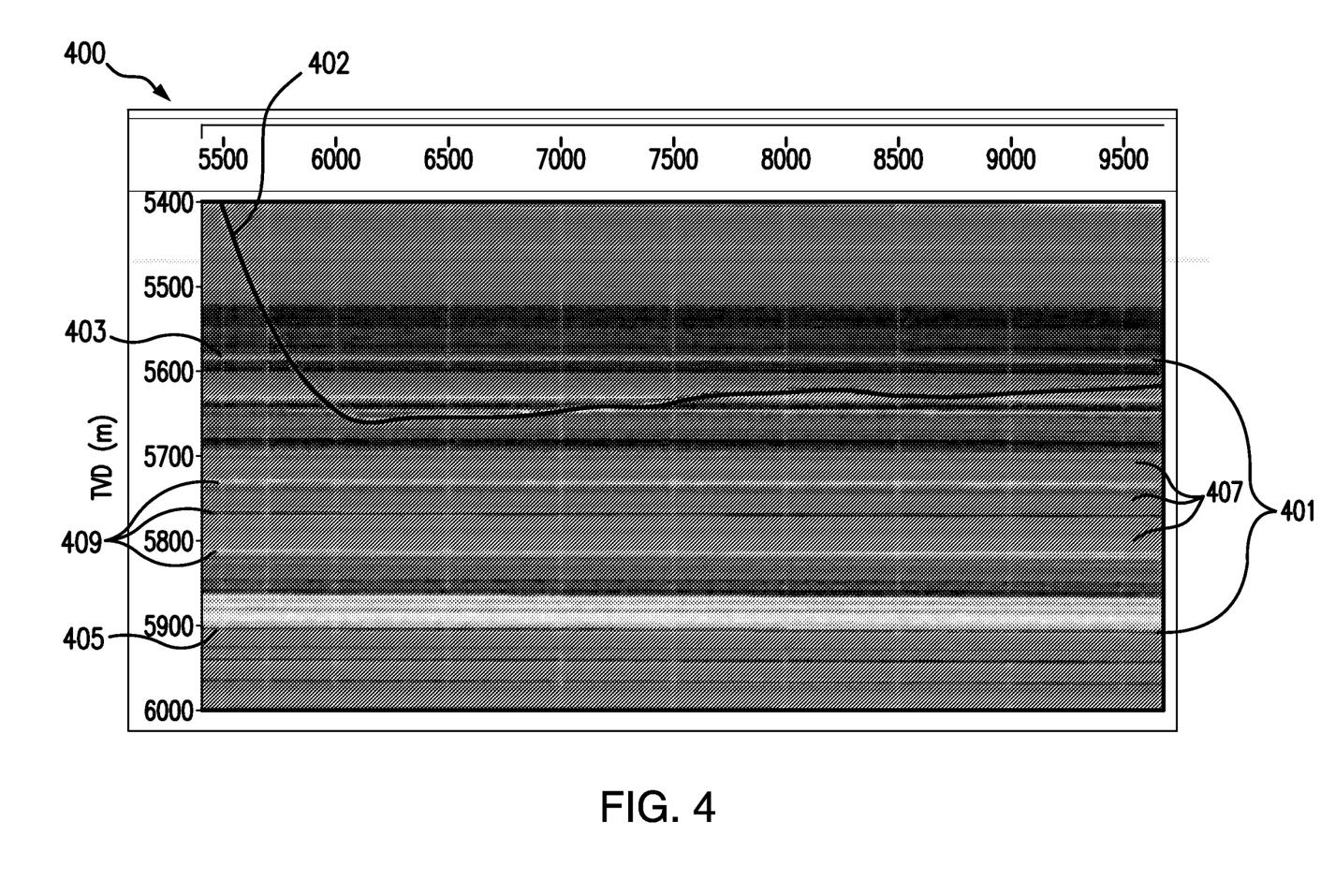
FIG. 4 illustrates an embodiment of a total vertical depth (TVD) vs. wellbore length graph in accordance with this disclosure.

To illustrate this portion of the embodiment of the method, FIG. 4 depicts an embodiment of a graph 400 of total vertical depth of the wellbore (TVD, shown in the vertical axis) versus wellbore length (shown in the horizontal axis), shown by wellbore line 402. In certain embodiments, graph 400 may be depicted on any suitable display for a user to visualize uncorrelated vertical formation data.

As shown, the horizontal formation members 401 can be depicted initially on the graph 400 as straight lines based on the vertical formation data. The graph 400 as shown indicates (e.g., in the form of shading) gamma ray distribution generated from the vertical formation data (e.g., from the vertical offset well). As shown, darker shades (e.g., dark brown) can indicate a higher API gravity value and lighter shades (e.g., yellow) can indicate lower API gravity values.

In certain embodiments, initially defining the one or more horizontal formation members 401 can include defining a formation top 403 and a formation bottom 405 which can define any suitable predetermined limits of the reservoir (e.g., calculated production limits of a reservoir, shale boundaries, etc.). Additionally or alternatively, initially defining one or more horizontal formation members 401 can further include defining one or more horizontal intraformation members 407 within the formation top 403 and the formation bottom 405. For example, any other suitable number of boundary lines 409 having any suitable weights, colors, and/or other characteristics can be used to depict the boundaries of one or more horizontal intraformation members 407 between the formation top 403 and the formation bottom 405.

Figure 5:
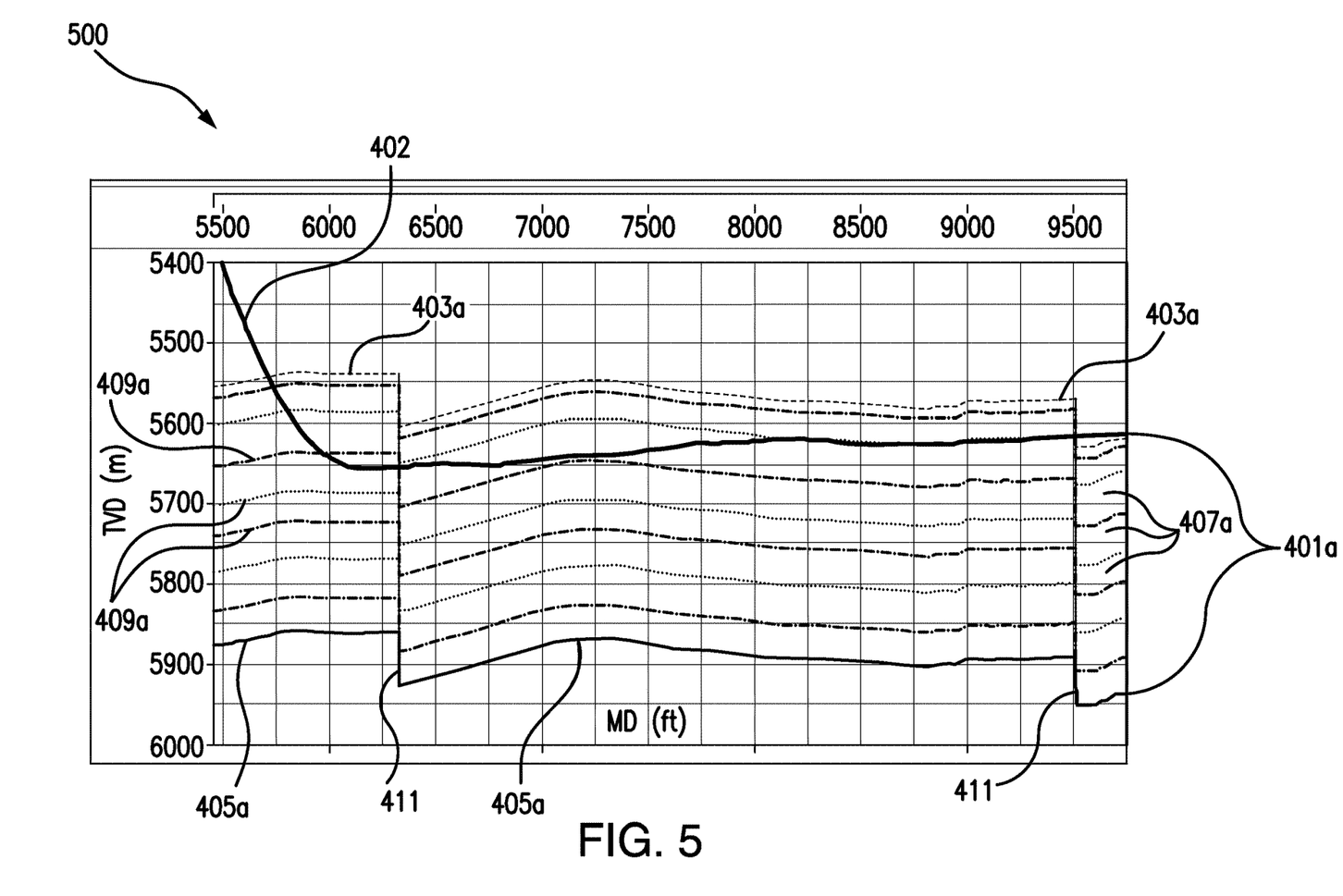
FIG. 5 illustrates an embodiment of a total vertical depth (TVD) vs. wellbore length graph in accordance with this disclosure.

Correlating the vertical formation data and the near-wellbore horizontal data can include, for example, vertically shifting the horizontal formation members 401 (and/or the horizontal intraformation members) based on the near-wellbore horizontal formation data and/or vertical formation data. To illustrate this portion of the embodiment of the method, FIG. 5 depicts an embodiment of a graph 500 of total vertical depth of the wellbore (TVD, shown in the vertical axis) versus wellbore length (shown in the horizontal axis), shown by wellbore line 402 similar to that that of FIG. 4. In certain embodiments, graph 500 may be depicted on any suitable display for a user to visualize correlated vertical and horizontal formation data.

As shown in FIG. 5, adjusted formation members 401a and/or adjusted intraformation members 407a can be depicted via adjusted formation top 403a, adjusted formation bottom 405a, and any other suitable number of adjusted boundary lines 409a. Such a plot as shown on graph 500 can visually indicate more accurate representations of the actual shape of geological formation members and intraformation members.

In certain embodiments, correlating the vertical formation data and the near-wellbore horizontal data can include defining a fault line 411 at a discontinuity. For example, as shown, where the boundary lines 409a have discontinuity of a predetermined amount, a fault can be determined to exist and can be displayed as fault line 411 on graph 500. The fault line 411 can be displayed as purely vertical or in any other direction (e.g., slanted).

The wellbore line 402 as shown in FIG. 5 indicates how the wellbore was drilled through different intervals of the stratigraphic column. Graph 500 is shown displayed without shading to make the subsurface changes easier to visualize, however, it is contemplated that similar shading (e.g., from gamma ray data) can be incorporated on graph 500 similar to graph 400.

The method can further include calculating a distance from a wellbore to one or more of the formation members 401a and/or intraformation members 407a. For example, FIG. 6 graphically shows the distances between the wellbore line 402 and the adjusted boundary lines 409a.

Figure 6:
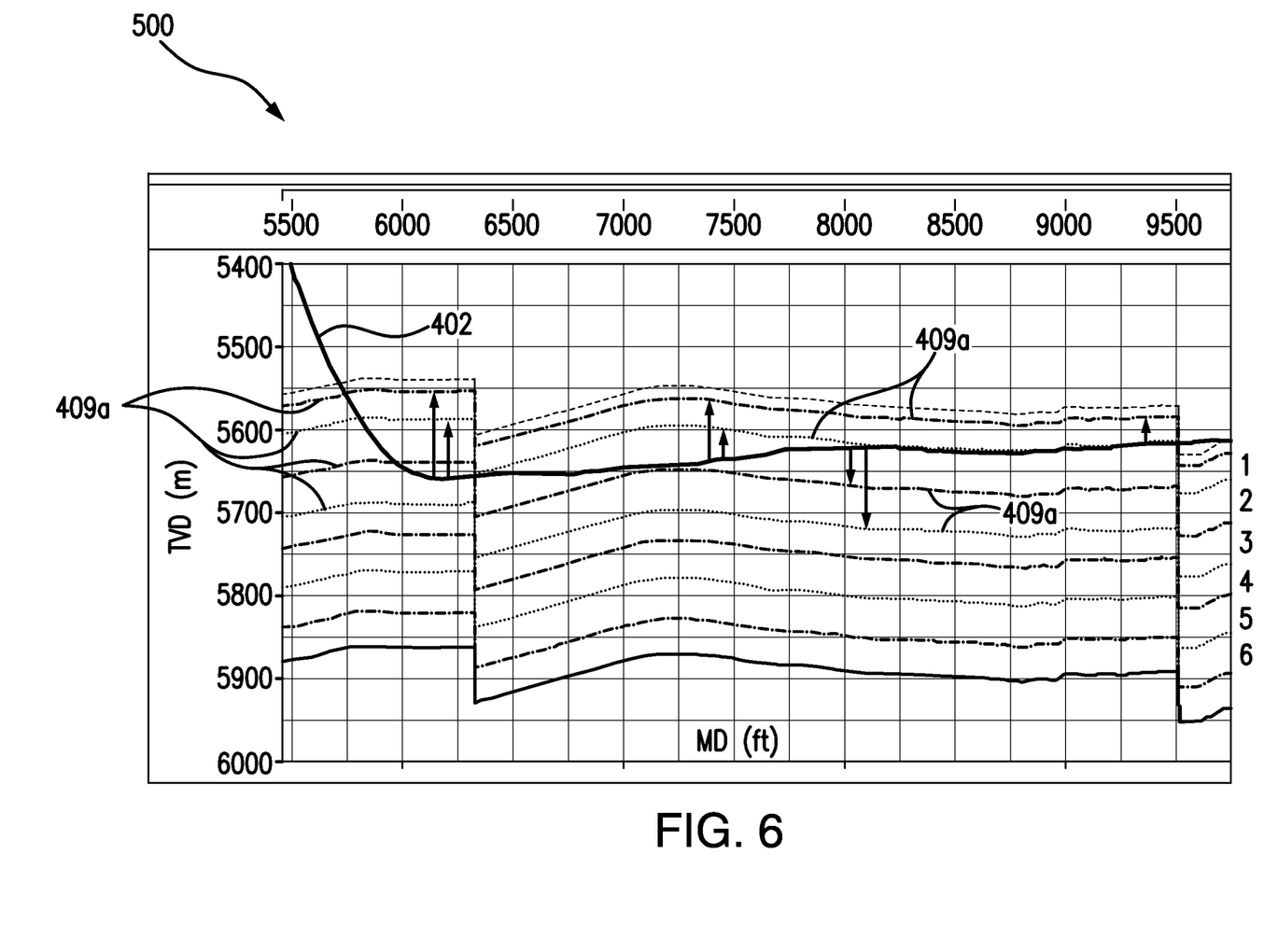
FIG. 6 illustrates an embodiment of a total vertical depth (TVD) vs. wellbore length graph in accordance with this disclosure.

In certain embodiments, the method can further include extrapolating, from the vertical formation data, constant reservoir properties for at least one formation member 401a and/or intraformation members 407a along the length of one or more of the formation members 401a and/or intraformation members 407a. This can allow for a uniform assumption for each formation member 401a and/or intraformation member where insufficient data is available to make a more accurate assessment.

The method can further include calculating at least one reservoir property based on correlated horizontal and vertical formation data. In certain embodiments, calculating the at least one reservoir property can include calculating at least one of a total volume of hydrocarbon (e.g., hydrocarbon pore volume) within a reservoir and/or calculating a volume of hydrocarbon as a function of wellbore length and reservoir thickness and/or any other measure of reservoir quality (e.g., brittleness, ductility, flow capacity, kerogen content, total organic carbon (TOC), thermal maturity, reservoir pressure).

The method can further include determining one or more fracking locations, intervals, stage spacing, and/or any other suitable fracking properties as a function of the reservoir properties beyond the wellbore instrument range. For example, based on the adjusted formation members 401a and/or intraformation members 407a, the distance to the adjusted formation top 403a and/or bottom 405a can be calculated allowing the user to determine where an ideal detonation (and/or of what power) for fracking can take place to maximize production. The method can further include pumping a fracturing fluid to one or more of the geological formations to fracture the geological formations using a pump. In certain embodiments, the above aspects or any combination thereof, the method can further include mixing one or more of a fracturing fluid or a drilling mud using a mixer.

While some of the above mentioned portions of the embodiment of the method are shown as being plotted and/or capable of display to a user (e.g., in the form of graphs 400 and 500), it is contemplated that any and/or all suitable portions of the above described method can be purely computational such that only final results of such computations are indicated on a properties chart. For example, referring to FIG. 7, the method can include displaying a properties chart 700 showing at least one or more reservoir properties indicating any suitable property of the reservoir outside of the wellbore instrument range along the horizontal or deviated portion of the wellbore.

Figure 7:
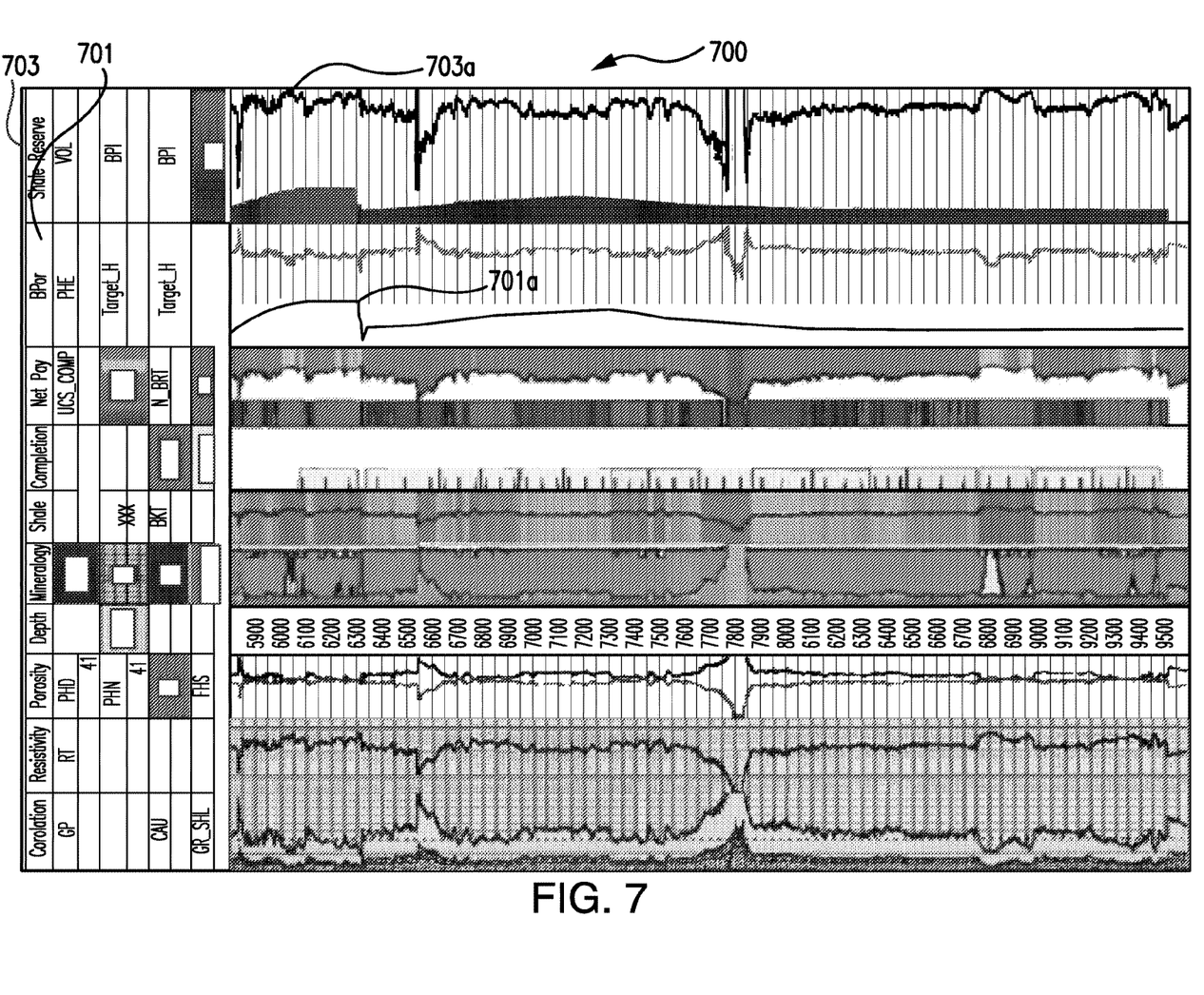
FIG. 7 illustrates an embodiment of a reservoir property chart in accordance with this disclosure.

For example, the first six tracks from the bottom up of chart 700 show typical log data like porosity, gamma ray, resistivity, brittleness, and mineralogy, all describing the near wellbore reservoir characteristics. On track 701 a reservoir thickness curve 701*a* can be displayed which can be determined as the total thickness of the reservoir above and below the wellbore within the reservoir top 403*a* and bottom 405*a* (e.g., or between any other predetermined limits such as thickness that best practices indicate best pay, which criterion can be changed and adjusted for each specific area and reservoir). On track 703 there is a benchmark productivity index (BPI) curve 703*a* which is calculated as a sum of hydrocarbon saturation and reservoir thickness along the horizontal direction.

In accordance with at least one aspect of this disclosure, a non-transitory computer readable storage medium and one or more computer programs embedded therein includes computer programs comprising instructions executable by a computer system. The instructions include any and/or all suitable portions of a method as described above.

In accordance with at least one aspect of this disclosure, referring to FIG. 8, a system 800 includes a wellbore 805 and a computer 807 configured to execute computer readable instructions, the instructions comprising any and/or all suitable portions of a method as described herein. The wellbore can include at least one horizontal or deviated (e.g., non-vertical) portion (e.g., within reservoir 801). The system 800 can further include one or more vertical or deviated offset wells 803 that are offset from the wellbore 805. For example, vertical offset well 803 can be created in the vicinity of the main wellbore 805 at least as vertically deep as the deepest portion of the main wellbore 805.

While the system 800 is shown including one or more offset wells 803, it is contemplated that the system 800 can, additionally or alternatively, utilize one or more of seismic data, one or more pilot wells, and/or the vertical section of the same horizontal that is desired for study later on (e.g., for retro analysis). In certain embodiments, there could be either a pilot vertical well prior to drilling the horizontal or the vertical section could be fully logged and used as the interval to generate the vertical reservoir description. It is contemplated that seismic data could also be processed to generate a vertical reservoir description.

The computer 807 can be configured to communicate with and/or receive data from any suitable drilling tool and/or logging tool and/or measurement tool. The data can include any suitable data as described herein. It is also contemplated that sets of data from already drilled offset wells 803 or the wellbore 805 may be imported after the fact into the computer 807 without the computer having to connect directly to any particular tool.

The computer 807 can further includes instructions for at least one of formulating a drilling fluid, formulating a fracking fluid, pumping a drilling fluid, pumping a fracking fluid, or placing a fracking fluid containing proppant within a fracture. Any other suitable portions of a method for drilling as known in the art can be stored on and/or executed by computer 807 in conjunction with any suitable drilling device. For example, the instructions can further include fracturing the geological formation after correlating the vertical formation data and the near-wellbore horizontal data. Fracturing can include placing and detonating a fracturing charge and or any other suitable step.

As described above, the disclosed embodiments allow for reservoir descriptions along horizontal wells, even outside of a wellbore instrument range (e.g., all the way to where best practices in drilling suggest that hydraulic fractures are capable of draining the reservoir). For example, certain embodiments allow calculating reservoir properties tens or hundreds feet above and/or below the horizontal well portion of a wellbore 805. This distance may be limited mainly by the availability of vertical and/or deviated logs used to provide the vertical formation data.

The methods and systems as described above allow engineered completion designs for horizontal wells to be generated by doing the best stimulation where the best reservoir is located along the lateral. While there are reservoirs where analysis with wellbore instrumentation logs are enough, there are many others (e.g., Niobrara, EagleFord, Monterrey, Vaca Muerta) where the thickness is larger than the logs radius of investigation. Accordingly, the hereinabove described embodiments are a superior approach for building a reservoir description along horizontal wells for completion optimization in such wider reservoirs.

Aspects

In accordance with at least one aspect of this disclosure, a computer-implemented method for modeling a reservoir includes receiving, at a processor, vertical formation data describing geological formations in a vertical direction as a function of vertical depth, receiving, at the processor, near-wellbore horizontal formation data describing the geological formations in a horizontal or deviated direction near a wellbore up to a wellbore instrument range, and correlating the vertical formation data with the near-wellbore horizontal formation data to create horizontally adjusted formation data to describe the geological formations in the vertical direction beyond the wellbore instrument range, along the horizontal or deviated direction.

In accordance with aspects above, receiving vertical formation data can include receiving vertical formation data from one or more vertical or deviated offset wells, seismic data, pilot wells, and/or a vertical section of the wellbore.

In accordance with any of the above aspects or any combination thereof, the vertical formation data or near-wellbore horizontal data can include at least one of seismic data, mud log data, gamma ray data, x-ray diffraction (XRD) data, x-ray fluorescence (XRF), cuttings and/or core data, pressure and rate-transient data, or any other suitable open hole logging, cased hole logging, logging while drilling (LWD), or measurement while drilling (MWD) data.

In accordance with any of the above aspects or any combination thereof, the method can further include uniformly extrapolating the vertical formation data along the horizontal before correlating the horizontal formation data with the vertical formation data.

In accordance with any of the above aspects or any combination thereof, the method can further include initially defining one or more horizontal formation members as a function of the vertical and/or horizontal formation data.

In accordance with any of the above aspects or any combination thereof, initially defining the one or more horizontal formation members can include defining a formation top and a formation bottom defining predetermined limits of the reservoir.

In accordance with any of the above aspects or any combination thereof, initially defining one or more horizontal formation members can further include defining one or more intraformation members within the formation top and the formation bottom.

In accordance with any of the above aspects or any combination thereof, correlating the vertical formation data and the near-wellbore horizontal data can include vertically shifting the horizontal formation members based on the near-wellbore horizontal formation data and/or vertical formation data.

In accordance with any of the above aspects or any combination thereof, correlating the vertical formation data and the near-wellbore horizontal data can include defining a fault line at a discontinuity.

In accordance with any of the above aspects or any combination thereof, the method can further include calculating a distance from a wellbore to one or more of the formation and/or intraformation members.

In accordance with any of the above aspects or any combination thereof, the method can further include extrapolating from the vertical formation data constant reservoir properties for at least one formation and/or intraformation members, along the length of one or more of the formation members and/or intraformation members.

In accordance with any of the above aspects or any combination thereof, the method can further include calculating at least one reservoir property based on correlated horizontal and vertical formation data.

In accordance with any of the above aspects or any combination thereof, calculating the at least one reservoir property can include calculating at least one of a total volume of hydrocarbon (e.g., hydrocarbon pore volume) within a reservoir or calculating a volume of hydrocarbon as a function of wellbore length and reservoir thickness and/or any other measure of reservoir quality (e.g., brittleness, ductility, flow capacity, kerogen content, total organic carbon (TOC), thermal maturity, reservoir pressure).

In accordance with any of the above aspects or any combination thereof, the method can further include determining one or more fracking locations, intervals, stage spacing, or other fracking properties as a function of the reservoir properties beyond the wellbore instrument range.

In accordance with any of the above aspects or any combination thereof, the method can further include pumping a fracturing fluid to one or more of the geological formations to fracture the geological formations using a pump.

In accordance with any of the above aspects or any combination thereof, the method can further include mixing one or more of a fracturing fluid or a drilling mud using a mixer.

In accordance with at least one aspect of this disclosure, a non-transitory computer readable storage medium and one or more computer programs embedded therein includes computer programs comprising instructions executable by a computer system. The instructions include receiving vertical formation data describing geological formations in a vertical direction as a function of vertical depth, receiving near-wellbore horizontal formation data describing the geological formations in a horizontal or deviated direction near a wellbore up to a wellbore instrument range, and correlating the vertical formation data with the near-wellbore horizontal formation data to create horizontally adjusted formation data to describe the geological formations in the vertical direction beyond the wellbore instrument range, along the horizontal or deviated direction.

In accordance with any of the above aspects or any combination thereof, receiving vertical formation data can include receiving vertical formation data from one or more vertical or deviated offset wells, seismic data, pilot wells, and/or a vertical section of the wellbore.

In accordance with any of the above aspects or any combination thereof, the vertical formation data or near-wellbore horizontal data can include at least one of seismic data, mud log data, gamma ray data, x-ray diffraction (XRD) data, x-ray fluorescence (XRF), cuttings and/or core data, pressure and rate-transient data, or any other suitable open hole logging, cased hole logging, logging while drilling (LWD), or measurement while drilling (MWD) data.

In accordance with any of the above aspects or any combination thereof, the instructions can further comprise uniformly extrapolating the vertical formation data along the horizontal before correlating the horizontal formation data with the vertical formation data.

In accordance with any of the above aspects or any combination thereof, the instructions can further comprise initially defining one or more horizontal formation members as a function of the vertical and/or horizontal formation data.

In accordance with any of the above aspects or any combination thereof, initially defining the one or more horizontal formation members can include defining a formation top and a formation bottom defining predetermined limits of the reservoir.

In accordance with any of the above aspects or any combination thereof, initially defining one or more horizontal formation members can includes defining one or more intraformation members within the formation top and the formation bottom.

In accordance with any of the above aspects or any combination thereof, correlating the vertical formation data and the near-wellbore horizontal data can include vertically shifting the horizontal formation members based on the near-wellbore horizontal formation data and/or vertical formation data.

In accordance with any of the above aspects or any combination thereof, correlating the vertical formation data and the near-wellbore horizontal data can include defining a fault line at a discontinuity.

In accordance with any of the above aspects or any combination thereof, the instructions can further comprise calculating a distance from a wellbore to one or more of the formation and/or intraformation members.

In accordance with any of the above aspects or any combination thereof, the instructions can further comprise extrapolating from the vertical formation data constant reservoir properties for at least one formation and/or intraformation members, along the length of one or more of the formation members and/or intraformation members.

In accordance with any of the above aspects or any combination thereof, the instructions can further comprise calculating at least one reservoir property based on correlated horizontal and vertical formation data.

In accordance with any of the above aspects or any combination thereof, calculating the at least one reservoir property can include calculating at least one of a total volume of hydrocarbon within a reservoir or calculating a volume of hydrocarbon as a function of wellbore length and reservoir thickness or any other measure of reservoir quality.

In accordance with any of the above aspects or any combination thereof, the instructions can further comprise determining one or more fracking locations, intervals, stage spacing, or other fracking properties as a function of the reservoir properties beyond the wellbore instrument range.

In accordance with at least one aspect of this disclosure, a system includes a wellbore, and a computer configured to execute computer readable instructions, the instructions comprising, receiving vertical formation data describing geological formations in a vertical direction as a function of vertical depth, receiving near-wellbore horizontal formation data describing the geological formations in a horizontal or deviated direction near a wellbore up to a wellbore instrument range, and correlating the vertical formation data with the near-wellbore horizontal formation data to create horizontally adjusted formation data to describe the geological formations in the vertical direction beyond the wellbore instrument range, along the horizontal or deviated direction.

In accordance with any of the above aspects or any combination thereof, the system can further include one or more vertical or deviated offset wells that are offset from the wellbore.

In accordance with any of the above aspects or any combination thereof, receiving vertical formation data can include receiving vertical formation data from the one or more vertical or deviated offset wells.

In accordance with any of the above aspects or any combination thereof, the vertical formation data or near-wellbore horizontal data can include at least one of seismic data, mud log data, gamma ray data, x-ray diffraction (XRD) data, x-ray fluorescence (XRF), cuttings and/or core data, pressure and rate-transient data, or any other suitable open hole logging, cased hole logging, logging while drilling (LWD), or measurement while drilling (MWD) data.

In accordance with any of the above aspects or any combination thereof, the computer readable instructions can further include uniformly extrapolating the vertical formation data along the horizontal before correlating the horizontal formation data with the vertical formation data.

In accordance with any of the above aspects or any combination thereof, the computer readable instructions can further include initially defining one or more horizontal formation members as a function of the vertical and/or horizontal formation data.

In accordance with any of the above aspects or any combination thereof, initially defining the one or more horizontal formation members can include defining a formation top and a formation bottom defining predetermined limits of the reservoir.

In accordance with any of the above aspects or any combination thereof, initially defining one or more horizontal formation members further can include defining one or more intraformation members within the formation top and the formation bottom.

In accordance with any of the above aspects or any combination thereof, the vertical formation data and the near-wellbore horizontal data can include vertically shifting the horizontal formation members based on the near-wellbore horizontal formation data and/or any vertical formation data.

In accordance with any of the above aspects or any combination thereof, correlating the vertical formation data and the near-wellbore horizontal data can include defining a fault line at a discontinuity.

In accordance with any of the above aspects or any combination thereof, the computer readable instructions can further include calculating a distance from a wellbore to one or more of the formation and/or intraformation members.

In accordance with any of the above aspects or any combination thereof, the computer readable instructions can further include extrapolating from the vertical formation data constant reservoir properties for at least one formation and/or intraformation members, along the length of one or more of the formation members and/or intraformation members.

In accordance with any of the above aspects or any combination thereof, the computer readable instructions can further include calculating at least one reservoir property based on correlated horizontal and vertical formation data.

In accordance with any of the above aspects or any combination thereof, calculating the at least one reservoir property can include calculating at least one of a total volume of hydrocarbon within a reservoir or calculating a volume of hydrocarbon as a function of wellbore length and reservoir thickness or any other measure of reservoir quality.

In accordance with any of the above aspects or any combination thereof, the computer readable instructions can include determining one or more fracking locations, intervals, stage spacing, or other fracking properties as a function of the reservoir properties beyond the wellbore instrument range.

In accordance with any of the above aspects or any combination thereof, the computer can further includes instructions for at least one of formulating a drilling fluid, formulating a fracking fluid, pumping a drilling fluid, pumping a fracking fluid, or placing a fracking fluid containing proppant within a fracture.

In accordance with any of the above aspects or any combination thereof, the instructions can further include fracturing the geological formation after correlating the vertical formation data and the near-wellbore horizontal data.

In accordance with any of the above aspects or any combination thereof, fracturing can include placing and detonating a fracturing charge.

With certain illustrated embodiments described above, it is to be appreciated that various non-limiting embodiments described herein may be used separately, combined or selectively combined for specific applications. Further, some of the various features of the above non-limiting embodiments may be used without the corresponding use of other described features. The foregoing description should therefore be considered as merely illustrative of the principles, teachings and exemplary embodiments of this invention, and not in limitation thereof.

It is to be understood that the above-described arrangements are only illustrative of the application of the principles of the illustrated embodiments. Numerous modifications and alternative arrangements may be devised by those skilled in the art without departing from the scope of the illustrated embodiments, and the appended claims are intended to cover such modifications and arrangements.

What is claimed is:

1. A computer-implemented method for modeling a reservoir, said method comprising:
   collecting, by a processor, vertical formation data including at least a first gamma ray distribution value and a second gamma ray distribution value having a higher value than the first gamma ray distribution value;
   graphically depicting geological a plurality of formations in a vertical direction;
   receiving, at the processor, near-wellbore horizontal formation data describing the geological formations in a deviated direction near a wellbore up to a wellbore instrument range;
   vertically shifting formation members beyond the wellbore instrument range based on horizontally adjusted formation data, wherein the horizontally adjusted formation data is a product of vertical formation data correlated with the near-wellbore horizontal formation data, along the deviated direction; and
   fracturing one of the plurality of formations based on vertical formation data correlated with the near-wellbore horizontal formation data, along the deviated direction.

2. The method of claim 1, wherein receiving vertical formation data includes receiving vertical formation data from one or more vertical or deviated offset wells, surface locations, pilot wells, and/or a vertical section of the wellbore.

3. The method of claim 1, wherein the vertical formation data or near-wellbore horizontal data includes at least one of seismic data, mud log data, gamma ray data, x-ray diffraction (XRD) data, x-ray fluorescence (XRF), cuttings and/or core data, pressure and rate-transient data, or any other suitable open hole logging, cased hole logging, logging while drilling (LWD), or measurement while drilling (MWD) data.

4. The method of claim 1, further comprising uniformly extrapolating the vertical formation data along the horizontal before correlating the horizontal formation data with the vertical formation data.

5. The method of claim 4, further comprising initially defining one or more horizontal formation members as a function of the vertical and/or horizontal formation data.

6. The method of claim 5, wherein initially defining the one or more horizontal formation members includes defining a formation top and a formation bottom defining predetermined limits of the reservoir.

7. The method of claim 6, wherein initially defining one or more horizontal formation members further includes defining one or more intraformation members within the formation top and the formation bottom.

8. The method of claim 7, wherein correlating the vertical formation data and the near-wellbore horizontal data includes vertically shifting the horizontal formation members based on the near-wellbore horizontal formation data and/or vertical formation data.

9. The method of claim 8, wherein correlating the vertical formation data and the near-wellbore horizontal data include defining a fault line at a discontinuity.

10. The method of claim 8, further comprising calculating a distance from a wellbore to one or more of the formation and/or intraformation members.

11. The method of claim 8, further comprising extrapolating from the vertical formation data constant reservoir properties for at least one formation and/or intraformation members, along the length of one or more of the formation members and/or intraformation members.

12. The method of claim 8, further comprising calculating at least one reservoir property based on correlated horizontal and vertical formation data.

13. The method of claim 12, wherein calculating the at least one reservoir property includes calculating at least one of a total volume of hydrocarbon within a reservoir or calculating a volume of hydrocarbon as a function of wellbore length and reservoir thickness and/or any other measure of reservoir quality.

14. The method of claim 13, further comprising determining one or more fracking locations, intervals, stage spacing, or other fracking properties as a function of the reservoir properties beyond the wellbore instrument range.

15. The method of claim 1, further comprising pumping a fracturing fluid to one or more of the geological formations to fracture the geological formations using a pump.

16. The method of claim 1, further including mixing one or more of a fracturing fluid or a drilling mud using a mixer.

17. A non-transitory computer readable storage medium and one or more computer programs embedded therein, the computer programs comprising instructions executable by a computer system, the instructions comprising:

collecting, by a processor, vertical formation data including at least a first gamma ray distribution value and a second gamma ray distribution value having a higher value than the first gamma ray distribution value;

graphically depicting geological a plurality of formations in a vertical direction;

receiving, at the processor, near-wellbore horizontal formation data describing the geological formations in a deviated direction near a wellbore up to a wellbore instrument range;

vertically shifting formation members beyond the wellbore instrument range based on horizontally adjusted formation data, wherein the horizontally adjusted formation data is a product of vertical formation data correlated with the near-wellbore horizontal formation data, along the deviated direction; and identifying locations for hydraulic fracturing of geological formations based on vertical formation data correlated with the near-wellbore horizontal formation data, along the directions of formations discontinuities taking into account uncertainty of gamma ray detector coordinates during measurements.

18. The non-transitory computer readable medium of claim 17, wherein receiving vertical formation data includes receiving vertical formation data from one or more vertical or deviated offset wells, surface locations, pilot wells, and/or a vertical section of the wellbore.

19. The non-transitory computer readable medium of claim 17, wherein the vertical formation data or near-wellbore horizontal data includes at least one of seismic data, mud log data, gamma ray data, x-ray diffraction (XRD) data, x-ray fluorescence (XRF), cuttings and/or core data, pressure and rate-transient data, or any other suitable open hole logging, cased hole logging, logging while drilling (LWD), or measurement while drilling (MWD) data.

20. The non-transitory computer readable medium of claim 17, wherein the instructions further comprise uniformly extrapolating the vertical formation data along the horizontal before correlating the horizontal formation data with the vertical formation data.

21. A system, comprising:
a computer configured to execute computer readable instructions, the instructions comprising:

collecting, by a processor, vertical formation data including at least a first gamma ray distribution value and a second gamma ray distribution value having a higher value than the first gamma ray distribution value;

graphically depicting geological a plurality of formations in a vertical direction;

receiving, at the processor, near-wellbore horizontal formation data describing the geological formations in a deviated direction near a wellbore up to a wellbore instrument range;

vertically shifting formation members beyond the wellbore instrument range based on horizontally adjusted formation data, wherein the horizontally adjusted formation data is a product of vertical formation data correlated with the near-wellbore horizontal formation data, along the deviated direction; and fracturing one of the plurality of formations based on vertical formation data correlated with the near-wellbore horizontal formation data, along the deviated direction.

22. The system of claim 21, further comprising one or more vertical or deviated offset wells that are offset from the wellbore.

23. The system of claim 21, wherein the computer further includes instructions for at least one of formulating a drilling fluid, formulating a fracking fluid, pumping a drilling fluid, pumping a fracking fluid, or placing a fracking fluid containing proppant within a fracture.

24. The system of claim 21, wherein the instructions further include fracturing the geological formation after correlating the vertical formation data and the near-wellbore horizontal data.

25. The system of claim 24, wherein fracturing includes placing and detonating a fracturing charge.

* * * * *